(12) United States Patent
Beier

(10) Patent No.: US 11,195,735 B2
(45) Date of Patent: Dec. 7, 2021

(54) LOAD LOCK FOR A SUBSTRATE CONTAINER AND DEVICE HAVING SUCH A LOAD LOCK

(71) Applicant: Uwe Beier, Ottendorf-Okrilla (DE)

(72) Inventor: Uwe Beier, Ottendorf-Okrilla (DE)

( * ) Notice: Subject to any disclaimer, the term of this patent is extended or adjusted under 35 U.S.C. 154(b) by 0 days.

(21) Appl. No.: 16/967,221

(22) PCT Filed: Feb. 6, 2019

(86) PCT No.: PCT/DE2019/100123
§ 371 (c)(1),
(2) Date: Aug. 4, 2020

(87) PCT Pub. No.: WO2019/154462
PCT Pub. Date: Aug. 15, 2019

(65) Prior Publication Data
US 2021/0082723 A1 Mar. 18, 2021

(30) Foreign Application Priority Data
Feb. 7, 2018 (DE) ...................... 10 2018 102 762.1

(51) Int. Cl.
*H01L 21/67* (2006.01)
*H01L 21/677* (2006.01)

(52) U.S. Cl.
CPC .. *H01L 21/67201* (2013.01); *H01L 21/67294* (2013.01); *H01L 21/67766* (2013.01); *H01L 21/67772* (2013.01)

(58) Field of Classification Search
CPC ......... H01L 21/67201; H01L 21/67294; H01L 21/67766; H01L 21/67772; H01L 21/67748; H01L 21/67778
See application file for complete search history.

(56) References Cited

U.S. PATENT DOCUMENTS 4,663,009 A * 5/1987 Bloomquist ............ C23C 14/14
204/192.15
5,044,871 A 9/1991 Davis et al.
(Continued)

FOREIGN PATENT DOCUMENTS

DE   10 2004 062 591 A1   7/2006
DE      198 82 568 B4    2/2008
JP         06310463 A  * 11/1994

OTHER PUBLICATIONS

Examination Report dated Oct. 29, 2018 in corresponding German Application No. 10 2018 102 762.1; 9 pages including partial machine-generated English-language translation.
(Continued)

*Primary Examiner* — Glenn F Myers
(74) *Attorney, Agent, or Firm* — Maier & Maier, PLLC

(57) ABSTRACT

A load lock for a substrate container for receiving flat substrates, wherein the load lock has a load chamber for receiving the substrate container that has a bottom, a ceiling, a rear wall, a front wall, a first side wall and a second side wall that connect the rear wall to the front wall, and wherein a carrier unit for receiving the substrate container is arranged in the load chamber. Here, it is provided that the load chamber can be divided into a first part and a second part along a dividing plane to open the load chamber, wherein the dividing plane extends toward the rear wall offset from the front wall through the first side wall, the second side wall, the bottom and the ceiling of the load chamber.

11 Claims, 11 Drawing Sheets

(56) References Cited

U.S. PATENT DOCUMENTS

| | | |
|---|---|---|
| 6,395,648 B1 | 5/2002 | Yoo |
| 6,454,519 B1 | 9/2002 | Toshima et al. |
| 2003/0103836 A1* | 6/2003 | Beaulieu .......... H01L 21/67167 |
| | | 414/217 |
| 2006/0045663 A1 | 3/2006 | Aggarwal et al. |
| 2006/0102237 A1 | 5/2006 | Le Guet et al. |
| 2008/0000422 A1* | 1/2008 | Park ................ H01L 21/67742 |
| | | 118/712 |
| 2014/0265090 A1* | 9/2014 | Hou ................ H01L 21/68785 |
| | | 269/14 |
| 2016/0035596 A1* | 2/2016 | Kamiya ............ H01L 21/67778 |
| | | 414/225.01 |
| 2017/0025290 A1* | 1/2017 | Wakabayashi .... H01L 21/67201 |
| 2018/0272390 A1* | 9/2018 | Ulloa ................ H01L 21/6773 |

OTHER PUBLICATIONS

Notification of Transmittal of Translation of the International Preliminary Report on Patentability (Chapter II) dated Aug. 13, 2020 in corresponding International Application No. PCT/DE2019/100123; 6 pages.

International Search Report dated Apr. 8, 2019 in corresponding International application No. PCT/DE2019/100123; 6pages.

International Preliminary Report on Patentability dated Jan. 22, 2020 of corresponding International Application No. PCT/DE2019/100123; 14 pgs.

* cited by examiner

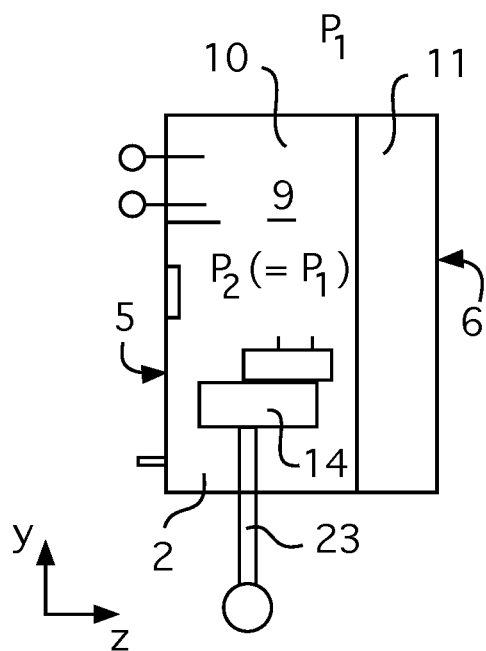
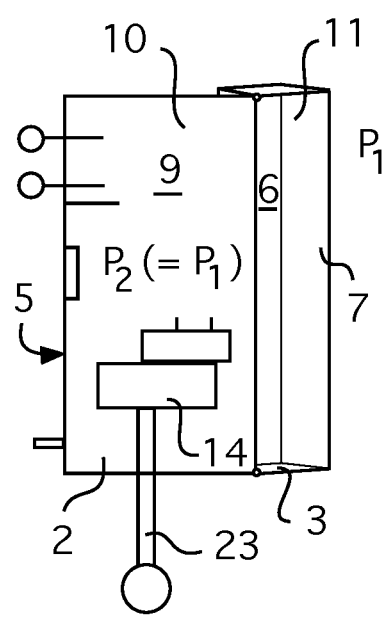
Fig. 8a    Fig. 8b
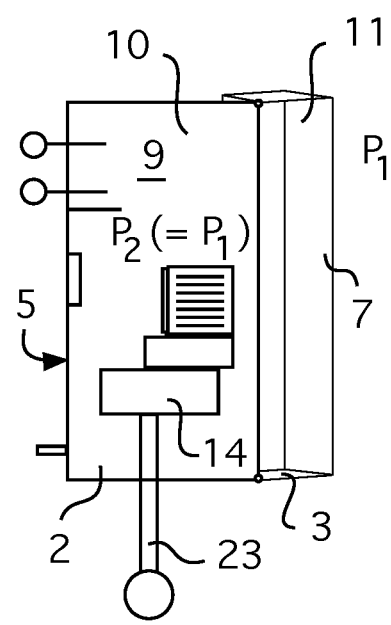
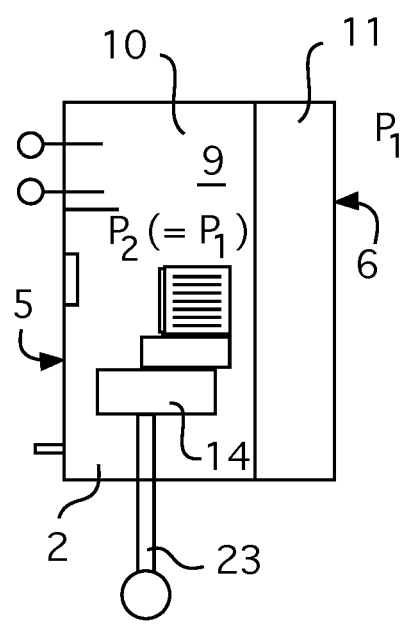
Fig. 8c    Fig. 8d

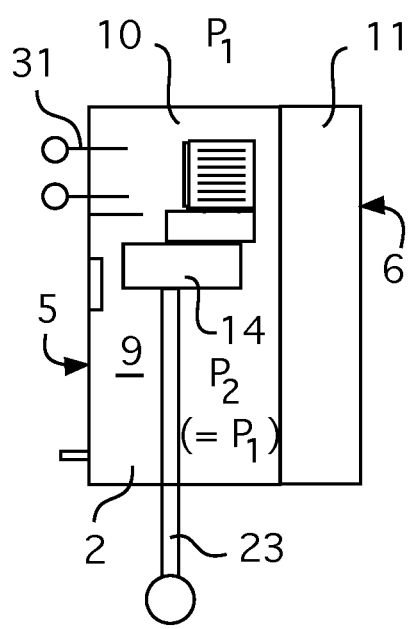
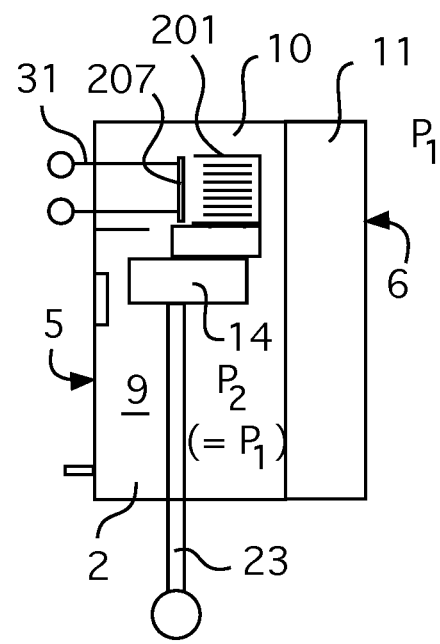
Fig. 8e
Fig. 8f
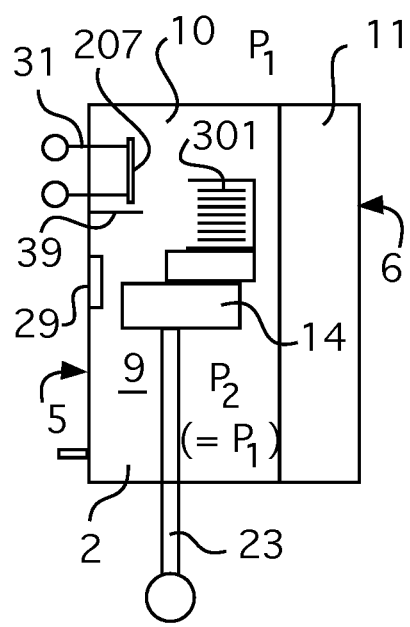
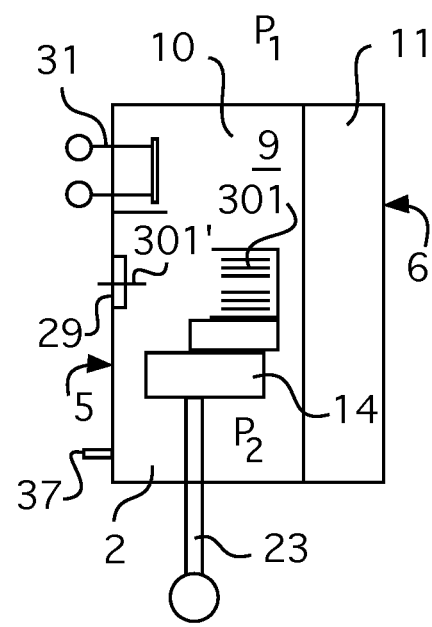
Fig. 8g
Fig. 8h

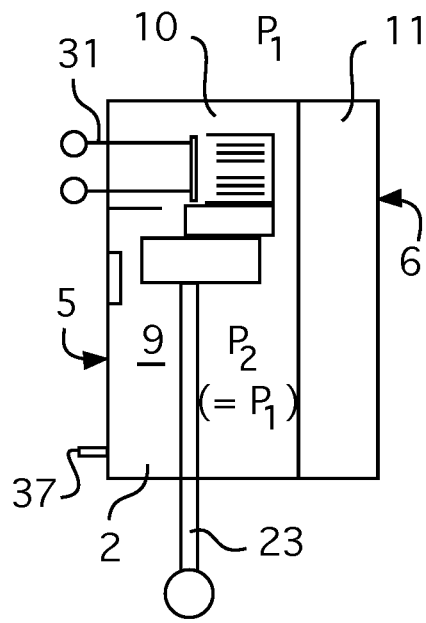
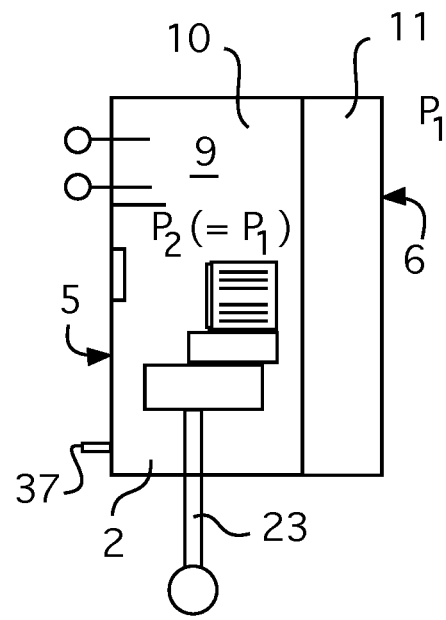
Fig. 8i  Fig. 8j
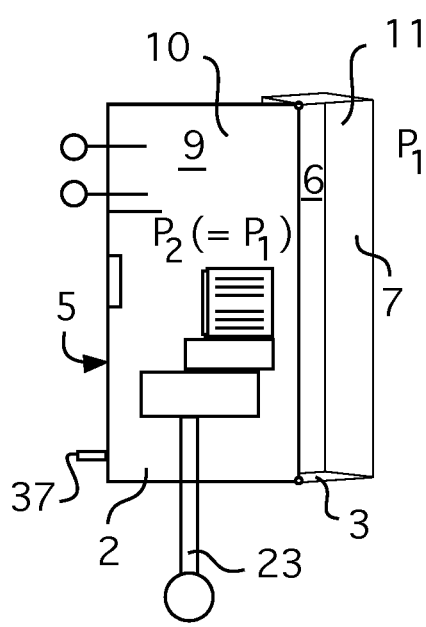
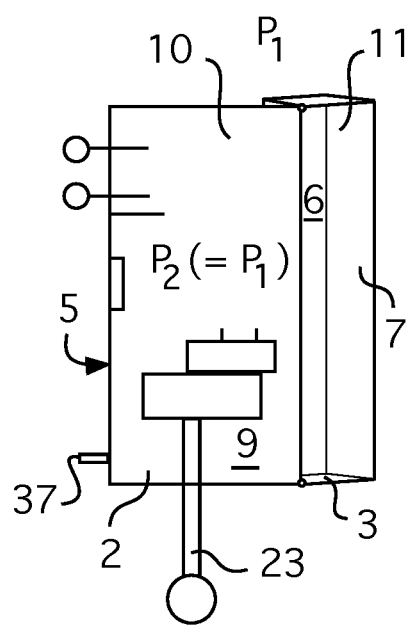
Fig. 8k  Fig. 8l

LOAD LOCK FOR A SUBSTRATE CONTAINER AND DEVICE HAVING SUCH A LOAD LOCK

FIELD

The disclosure relates to a load lock for a substrate container, a device having such a load lock, and a method for operating such a load lock.

BACKGROUND

In semiconductor industry substrate boxes are employed to store and transport flat substrates, for example of wafers. Generally, here standardized substrate boxes are employed that are referred to as "front-opening unified pods" (FOUP). Such a substrate box has a housing having a bottom, a ceiling as well as side walls. An access opening is formed in a side wall. The substrate box has a lid for closing the access opening. In the interior of the housing carriers for several substrates are formed that are spaced apart from each other. The carriers can contain one or more cassettes in the substrate box, wherein each of the cassettes can receive one or more substrates. Here, the substrates with their surface sides lie substantially in parallel to the bottom of the substrate box in the substrate box. One or more cassettes can be introduced into the interior of the housing and taken out of the interior through the opened access opening. One embodiment of such a substrate box is described in DE 198 82 568 B4. Details on the standardized substrate boxes are described in the publications of the association "Semiconductor Equipment and Materials International". The substrate boxes are described in SEMI E47.1-0704 "Provisional Mechanical Specification for FOUPS Used to Transport and Store 300 mm Wafers" in the version published in July 2004. The cassettes are described in SEMI G77-0699 (Reapproved 0706) "Specification for Frame Cassette for 300 MM Wafers" in the version published in June 2006. In the substrate box the substrates are under atmospheric pressure.

Generally, process plants with which the wafers can be processed have a so-called load port tuned to the standardized substrate boxes. Such a load port is shown in DE 10 2004 062 591 A1. The load port has a horizontally extending base plate bearing a tie plate on which the standardized substrate box can be arranged with a positive fit. The load port further has an opening through which substrates can be transferred from the opened substrate box in a lock and vice versa. The lock which is not part of the load port but generally already belongs to the process plant after having closed the opening enables to adjust the atmosphere, in particular the pressure, temperature, and/or their chemical composition. In this way, the atmosphere in the lock can be adapted to the conditions present in the process chamber of the process plant or in the substrate box, so that transfer of substrates between the substrate box and the process chamber is enabled without changing the atmosphere in the process chamber. In the process chamber processing of the substrates can be performed. In order to transfer a substrate between the substrate box and the lock, a first handling system is required. In order to transfer a substrate between the lock and the process chamber, a second handling system is required. Generally, the first and second handling system are robots.

US 2006/0045663 A1 discloses a load port with a base plate which has a special mechanism to open and close the lid of the substrate box referred to as door. The mechanism is to enable to rotate the lid about a vertical or horizontal axis. After having removed the lid the substrate box can be rotated about a horizontal axis, so that its access opening abuts on the opening in the load port. The base plate can be formed within a housing that has a housing door on one side wall in which the mechanism for the lid of the substrate box is formed. The housing is to enable to clean the atmosphere in the housing with a purge gas, so that the substrates contained in the substrate box are exposed only to controlled environment. Here, the purge gas through the opening in the load port also enters the lock. In practice, rotation of the substrate box on the base plate and the housing that is to enable the introduction of a purge gas did not catch on so far. In particular, the housing hinders the access to the substrate box the grips of which are no longer easily accessible by an operator.

US 2006/0102237 A1 suggests to refrain from an evacuation chamber in which the substrates which so far have been under atmospheric pressure in the substrate box are put under vacuum before they enter the process chamber. For that, the substrates shall be transported under vacuum. However, this requires substrate boxes that are hermetically sealed. These conditions are met by the standardized substrate boxes, so that the vacuum substrate boxes suggested in US 2006/0102237 A1 have not caught on in practice. However, even if the suggested vacuum substrate boxes are employed, so the process plant has to have a chamber referred to as "interface" into which the substrate is transferred from the substrate box before it can enter the process chamber after the opening closable with the lid has been opened.

SUMMARY

It is the object of the invention to eliminate the drawbacks according to the state of the art. In particular, provided is a load lock for a substrate container that enables substrates to be transferred between the standardized substrate containers and the process chamber without first having to transfer the substrates into a lock. Here, the access to the substrate container shall not be hindered. Furthermore, provided are a device with such a load lock and a method for operating such as load lock.

According to the invention, provided is a load lock for a substrate container for receiving flat substrates. The load lock has a load chamber for receiving the substrate container that has a bottom, a ceiling, a rear wall, a front wall, a first side wall and a second side wall that connect the rear wall to the front wall. A carrier unit for receiving the substrate container is arranged in the load chamber. The load chamber can be divided into a first part and a second part along a dividing plane to open the load chamber, wherein the dividing plane extends toward the rear wall offset from the front wall through the first side wall, the second side wall, the bottom, and the ceiling of the load chamber.

The rear wall of the load chamber is arranged offset from the front wall. Thus, the front wall of the load chamber is spaced apart from the substrate container when this is placed on the carrier unit. Arranging the dividing plane offset from the front wall ensures that access to the load chamber is easy. The load chamber neither hinders placing the substrate container on the carrier unit nor taking the substrate container from the carrier unit. The load lock according to the invention ensures that standardized substrate boxes can be used as substrate container, especially those in SEMI E47.1-0704 "Provisional Mechanical Specification for FOUPS Used to Transport and Store 300 mm Wafers" in the version published in July 2004. In addition to the standardized substrate boxes also other substrate boxes can be used as substrate containers, for example FOUPS for use and storage of 450 mm wafers. Preferably, the dividing plane is a vertical plane or a plane tilted by an angle of up to 45° to a vertical plane.

Preferably, the substrate container has a housing that has a bottom, a ceiling as well as side walls. The housing has an access opening for introducing one or more substrates into the substrate container or for taking out one or more substrates out of the substrate container. Preferably, the access opening is formed in one side wall of the substrate container. The substrate container has a lid for closing the access opening. Preferably, carriers for several substrates that are spaced apart from each are formed in the interior of the housing. The lid may be a door. The term "opened substrate container" relates to a substrate container with an open access opening. Here, the lid is taken off of the substrate container to open the access opening. The term "closed substrate container" relates to a substrate container with a closed access opening. Here, the lid is put onto the substrate container to close the access opening. The closed substrate container may be configured in a pressure-tight manner. In this way, the substrates contained therein can be protected against particle contamination. In the closed substrate container atmospheric pressure may prevail, wherein also another pressure may be set in the substrate container. An interlocking mechanism may be provided for detachable connection of the lid to the substrate container.

The substrate container can receive one or more substrates. The substrates are flat substrates, for example wafers such as a silicon wafer. The term "flat substrate" means a body that in two directions of a Cartesian coordinate system has a larger expansion, typically a much larger expansion than in the third direction of the Cartesian coordinate system. In other words, width and length of the flat substrate are larger, typically much larger than its height. With flat substrates having a substantially circular cross section their radius is larger than their height. A flat substrate may have a flat lower surface and/or a flat upper surface, wherein preferably both the lower surface and the upper surface are formed flat. Preferably, the lower surface and the upper surface extend in parallel and aligned with each other.

To open the load chamber the load chamber is divided into a first part and a second part, whereby the load chamber is brought in its open state. In the open state the substrate container can be mechanically placed on the carrier unit or by an operator or taken off of the carrier unit.

The load chamber is limited by the rear wall, the front wall, the first side wall, the second side wall, the bottom, and the ceiling. In the following, the rear wall, the front wall, the first side wall, the second side wall, the bottom, and the ceiling are commonly also referred to as walls. Preferably, the front wall is opposite to the rear wall. Preferably, the load lock is arranged on a process plant in which the substrates can be processed such that the rear wall of the load chamber abuts on the housing of the process plant.

To close the load chamber the second part is moved toward the first part until the second part abuts on the first part. In this way, the load chamber is brought into the closed state. The first part and the second part in the closed state abut on each other such that the load chamber is sealed against the environment. The walls of the load chamber in the dividing plane preferably have sealing means, so that in the closed state the first part and the second part are tightly interconnected.

The load chamber can be opened and closed by an operator or in an automated manner The carrier unit can have a base element having an upper surface and a lower surface. Here, the upper surface is in a horizontal plane. The base element may be a base plate. A tie plate may be arranged on the upper surface of the base element. The substrate container can be placed on the tie plate with its lower surface. The tie plate can be configured such that a positive connection can be made between the lower surface of the substrate container and the tie plate. The carrier unit can have coupling elements to ensure a safe fit of the substrate container. The carrier unit can have positioning elements, for example positioning pins to facilitate positioning of the substrate container on the carrier unit.

It may be provided that the load lock has pressure adjusting means for adjusting the pressure in the load chamber. When the load chamber in the closed state is sealed against the environment, so the pressure in the load chamber can be adjusted by means of pressure adjusting means. The pressure that can be adjusted in the load chamber by means of the pressure adjusting means can differ from the environmental pressure. For example, a negative pressure or an excessive pressure may be adjusted, e.g. negative pressure or an excessive pressure that differ by 0.1, 0.5, 1.0, 5.0, 10.0 bar from the environmental pressure. Typically, the environmental pressure will be atmospheric pressure. Thus, in the open state atmospheric pressure will prevail in the load chamber as the environmental pressure. If now the load chamber is brought from the opened to the closed state, so after having connected the first to the second part of the load chamber and thus having made the closed state, a pressure can be adjusted that deviates from the atmospheric pressure. If the load chamber is to be brought from the closed state to the open state, so it may be necessary to adjust a pressure in the load chamber before opening that corresponds to the environmental pressure.

To adjust a negative pressure or an excessive pressure, an opening can be formed in one of the walls of the load chamber, for example in the rear wall, that is equipped with a valve to open or close the opening. To adjust a negative pressure, the load chamber may be connected to a system to generate a negative pressure, for example a vacuum pump, via a line. To adjust an excessive pressure, the load lock may be connected to a system to generate an excessive pressure, for example a compressor to generate a compressed gas, via a line. The load lock according to the invention can have one or more terminals for pressure equipment. The terminals enable to adjust a given pressure in the load chamber of the load lock.

It may be provided that the load lock according to the invention has a system for lifting and lowering the carrier unit in the load chamber. The system for lifting and lowering the carrier unit may be a lifting unit. By means of the lifting unit the carrier unit can be lifted or lowered in the load chamber. The term "lifting" the carrier unit in one embodiment of the invention means a motion of the carrier unit along a vertical axis toward the ceiling of the load chamber. The term "lowering" in one embodiment of the invention means a motion of the carrier unit along a vertical axis toward the bottom of the load chamber.

One or more guide means may be provided for guiding the carrier unit. The guide means may be arranged within and/or outside the load chamber. Preferably, the guide means is/are arranged in the load chamber on the rear wall thereof. For guiding the carrier unit on the guide means the carrier unit may have a slide. The guide means may be a guide rail. The slide may be movably arranged on the guide rail in the vertical direction.

A bushing for the lifting unit for lifting and lowering the carrier unit may be arranged in the bottom of the load chamber. The lifting unit may have a lifting rod that is inserted into the load chamber through the bushing. Suitably, the bushing is sealed. The lifting unit may interact with a lifting plate on which the carrier unit, for example the lower surface of the base element lies. The lifting unit may have a guide. Preferably, the guide is arranged outside the load chamber. The guide may be a guide for the lifting rod. The guide enables a vertical motion of the lifting rod. The lifting unit may have a lifting drive. Preferably, the lifting drive is arranged outside the load chamber, but it may also be arranged within the load chamber. The lifting drive may effect a motion of the lifting rod. The lifting unit may effect lifting of the carrier unit in the vertical direction and lowering the carrier unit in the vertical direction. Another lifting element may be provided instead of a lifting rod.

The load lock according to the invention may have a lock opening. The lock opening is to enable a transfer of a substrate out of or into the load chamber. For that, a handling system may be provided. The handling system may be part of a process plant for processing the substrate, for example a pressure process plant. Preferably, the lock opening is formed in the rear wall of the load chamber. Here, it is preferably arranged in alignment with an opening in the housing of the process plant, so that the handling system can insert a substrate from the load chamber of the load lock according to the invention into the process plant and from the process plant into the load chamber of the load lock according to the invention via the lock opening. The lock opening may be closed by means of a lock valve. For transferring a substrate from the load chamber into the process plant and from the process plant into the load chamber the lock valve is opened. In order to prevent a pressure compensation in the load chamber suitably the crossing between the lock opening in the rear wall of the load chamber and the opening in the process plant is sealed against the environment.

Preferably, the extension of the lock opening in the vertical direction is smaller than the extension of the access opening in the vertical direction. The extension of the lock opening is defined by the horizontal and vertical extension of a substrate that is present in the substrate container. When the substrates are flat bodies, then the extension of the lock opening in the vertical direction is smaller, typically much smaller than its extension in the horizontal direction. Thus, the lock opening may be a flat opening. For example, the lock opening may be slit-shaped, wherein its largest extension is in the horizontal.

The load lock may have a system for opening and closing the substrate container. Said system may be an opening mechanism with which the substrate container lid may be taken off from the access opening and put onto the access opening. It may be provided that the opening mechanism is arranged in the load chamber below or above the lock opening, wherein it is preferably arranged above the lock opening. Here, the term "below" relates to an arrangement between the lock opening and the bottom of the load chamber. Here, the term "above" relates to an arrangement between the lock opening and the ceiling of the load chamber. By means of the opening mechanism the substrate container lid can be taken off from the substrate container to open the access opening. Further, the opening mechanism upon opening the access opening can hold the substrate container lid. Moreover, by means of the opening mechanism the substrate container lid can be put onto the substrate container to close the access opening. If an interlocking mechanism for detachably connecting the substrate container lid with the substrate container is provided, so the opening mechanism has means for unlocking and interlocking the interlocking mechanism. That is, by means of the opening mechanism the interlocking mechanism can be unlocked before the substrate container lid is taken off from the substrate container. Moreover, by means of the opening mechanism the interlocking mechanism can be interlocked after the substrate container lid is put onto the substrate container.

The load lock according to the invention may have a first identification system for identifying a substrate container that is present in the load chamber. Preferably, the first identification system is arranged on the rear wall of the load chamber or on the carrier unit. The first identification system may be one or more sensors. The first identification system may be for determining the batch to which the substrates contained in the substrate container belong. The identified information on the batch may be used to track the substrates after they have been taken out of the substrate container.

The load lock according to the invention may have a second identification system for identifying substrates that are present in the substrate container. Preferably, the second identification system is arranged on the rear wall of the load chamber, particularly preferred between the opening mechanism and the lock opening. The second identification system may be one or more sensors. By means of the second identification system for example the presence and/or position of the substrates in the opened substrate container may be determined. In particular, presence check by means of the second identification system is advantageous.

Preferably, the lifting unit is a lifting unit for lifting or lowering the carrier unit to at least one of the following positions:
- an opening and closing position where the upper surface of the carrier unit is in a position that enables the opening mechanism to take off or put on the substrate container lid of a substrate container that is on the upper surface of the carrier unit;
- a transfer position where the upper surface of the carrier unit is in a position that enables transfer of a substrate out of or into a substrate container that is on the upper surface of the carrier unit; and
- if the load lock has an identification system, an identification position, wherein in the identification position the upper surface of the carrier unit is in a position where the identification system can identify a substrate in a substrate container that is on the upper surface of the carrier unit.

It may be provided that a substrate is in a transfer position if (i) it can be taken out of the substrate container in the horizontal direction and passed through the lock opening, namely without a change of its position in the vertical direction, or (ii) it can be passed through the lock opening in the horizontal direction and deposited in the substrate container on a free carrier, namely without changing its position in the vertical direction.

Thus, by means of the lifting unit a closed substrate container that is present on the upper surface of the carrier unit first can be brought to the opening and closing position where the lid is taken off by means of the opening mechanism to open the access opening of the substrate container. If an identification system is provided, subsequently the opened substrate container can be brought into the identification position where substrates that are present in the opened substrate container are identified. Then, the opened substrate container can be transferred from the identification position to a transfer position where a substrate can be taken out of the opened substrate container or inserted into the substrate container by means of a handling system. However, the substrate container can also directly be transferred from the first to the transfer position. Subsequently, the opened substrate container from a transfer position to transfer a first substrate can be transferred to another transfer position to transfer another substrate.

It may be provided that a separate transfer position is provided for each substrate that is to be taken out of the opened substrate container or inserted into the opened substrate container. This is particularly suitable if the lock opening is slit-shaped. In particular in this case it is preferred to position the substrate container by means of der lifting unit such that the substrate that is to be taken out of the substrate container is at the height of the lock opening, so that the substrate can be taken out of the substrate container by means of the handling system in the horizontal direction and passed through the lock opening, namely without changing its position in the vertical direction. This correspondingly also applies if a substrate is to be inserted into the open substrate container through the lock opening. Then, the substrate container by means of the lifting unit is positioned such that a free carrier that is to hold the substrate in the substrate container is at the height of the lock opening, so that the substrate can be inserted in the horizontal direction through the lock opening and deposited in the substrate container on the free carrier by means of the handling system, namely without changing its position in the vertical direction. The free carrier is given by a user or in an automated manner Thus, a separate transfer position may be provided for each transfer of a substrate.

Thus, by means of the lifting unit a closed substrate container that is present on the upper surface of the carrier unit first can be brought to the opening and closing position where the lid is taken off of the substrate container by means of the opening mechanism to open the access opening of the substrate container. If an identification system is provided, subsequently the opened substrate container can be brought into the identification position where substrates that are present in the opened substrate container can be identified. Then, the opened substrate container can be transferred to the transfer position from the identification position where substrates can be taken out of the opened substrate container or inserted into the substrate container by means of a handling system. However, the substrate container can also directly be transferred from the opening and closing position to the transfer position.

By means of the lifting unit an opened substrate container that is present on the upper surface of the carrier unit can be transferred from the transfer position or identification position to the opening and closing position. In the opening and closing position the opened substrate container can be closed by means of the opening mechanism by putting the lid onto the substrate container.

Preferably, the load lock according to the invention is configured such that it is possible to automatically introduce and take out substrate containers into/from the load chamber. Automatically introducing and taking out substrate containers into/from the load chamber may be possible for example by means of autonomous vehicles and/or transportation systems. The vehicles and/or transportation systems may effect transport of substrate containers to the load lock and away from the load lock.

According to the invention further provided is a device for processing flat substrates that has a process chamber for processing one or more flat substrates;
a load lock according to the invention; and
a handling system for transferring one or more substrates between a substrate container received by the carrier unit and the process chamber through the lock opening of the load chamber.

The device according to the invention represents a process plant for processing flat substrates. In the process chamber there is preferably set a pressure that differs from the environmental pressure that generally is atmospheric pressure. In this case, the device according to the invention represents a pressure process plant.

If the load lock according to the invention has a lock opening that is formed in the rear wall of the load chamber, so the lock opening preferably is arranged in alignment with an opening in the housing of the process plant. Then, by means of the handling system a substrate can be inserted from the load chamber of the load lock according to the invention into the process plant and/or from the process plant into the load chamber of the load lock according to the invention via the lock opening. However, instead of one substrate the handling system can also handle two or more substrates. In this case, a lock opening is required, the vertical extension of which enables two or more substrates to be transferred.

The device according to the invention may have more than one, for example two, three or more load locks according to the invention.

Moreover, according to the invention there is provided a method for operating a load lock according to the invention comprising the steps of:
(a) opening the load chamber by dividing it into the first and second part;
(b) putting a substrate container onto a carrier unit;
(c) closing the load chamber by joining the first and the second part;
(d) taking off the lid from the substrate container by means of an opening mechanism; and
(e) taking out at least one substrate of the substrate container;

wherein for carrying out steps (d) and (e) the carrier unit by means of a lifting unit for lifting or lowering the carrier unit is moved from
an opening and closing position where the upper surface of the carrier unit is in a position that enables the opening mechanism to take off or put on the substrate container lid of a substrate container that is present on the upper surface of the carrier unit; to
a transfer position where the upper surface of the carrier unit is in a position that enables a substrate to be transferred from or into a substrate container that is present on the upper surface of the carrier unit and wherein upon opening of the substrate container a pressure is set in the load chamber that differs from the atmospheric pressure. Further details of the method according to the invention have been described above in context with the load lock according to the invention. In particular, if the load lock has an identification system, the carrier unit can be lifted or lowered into an identification position by means of a lifting unit, wherein in the identification position the upper surface of the carrier unit is in a position where the identification system can identify a substrate in a substrate container that is present on the upper surface of the carrier unit.

The invention enables important savings compared to the prior art. The invention enables to refrain from a separate lock. In the invention the load port known in the prior art and the lock are not separated. Thus, the load lock according to the invention can combine the functions of the load port and the lock. Thus, the load lock according to the invention is more compact than the combination of load port and lock required so far. Hence, it is easier to arrange several load locks next to each other on a device for processing flat substrates in a space-saving manner. Also, a device according to the invention is possible, in which several load locks and several process chambers are arranged in a space-saving manner.

In addition, the device according to the invention for processing substrates only needs one handling system to transfer substrates between the substrate container and the process chamber. According to the prior art, two handling systems have been required, a first one for transferring between the load port and the lock and a second one for transferring between the lock and the process chamber. Because the device according to the invention has the load lock according to the invention, only the second handling system is required to move the substrate between the substrate container and the process chamber. The device according to the invention may have a process chamber and a handling system that are unchanged over the prior art. This is particularly advantageous for existing or at least known processing processes.

Thus, the invention saves space which is highly relevant in particular in clean rooms. Investment costs and operation costs decrease significantly. It is also advantageous that operation of the load lock according to the invention and thus, the device according to the invention stays unchanged from the view of an operator. Operation and procedure are substantially the same. In addition, with the invention an increase in process reliability is obtained. This is in particular attributed to the small number of components, the reduced number of crossing points for the substrate as well as less substrate handling. Tracking of the substrates in the device according to the invention is simplified, idle running of the device according to the invention is also simplified. Only a single pressure adaption per substrate box is required what is energetically favorable and means time saving. There are always all of the substrates of a substrate container available at the same time for processing which offers advantages for a batch-related processing, process reliability and run times. Finally, much less particle load is obtained, since significantly less components are employed.

The load lock according to the invention is suitable for receiving standardized substrate containers, for example FOUPs. Standardized substrate boxes help the operators to avoid errors, facilitate plant operation, and transport of substrates. They protect the substrates from damages.

BRIEF DESCRIPTION OF THE DRAWINGS

In the following, the disclosure is explained in detail by way of examples, that are not to limit the disclosure, with reference to the drawings. Here.

FIG. 8a shows simplified a views of an embodiment of a load lock according to the disclosure for illustration of the method according to the disclosure;

FIG. 8b shows a simplified view of an embodiment of a load lock according to the disclosure for illustration of the method according to the disclosure;

FIG. 8c shows a simplified view of an embodiment of a load lock according to the disclosure for illustration of the method according to the disclosure;

FIG. 8d shows a simplified view of an embodiment of a load lock according to the disclosure for illustration of the method according to the disclosure;

FIG. 8e shows a simplified view of an embodiment of a load lock according to the disclosure for illustration of the method according to the disclosure;

FIG. 8f shows a simplified view of an embodiment of a load lock according to the disclosure for illustration of the method according to the disclosure;

FIG. 8g shows a simplified view of an embodiment of a load lock according to the disclosure for illustration of the method according to the disclosure;

FIG. 8h shows a simplified view of an embodiment of a load lock according to the disclosure for illustration of the method according to the disclosure;

FIG. 8i shows a simplified view of an embodiment of a load lock according to the disclosure for illustration of the method according to the disclosure;

FIG. 8j shows a simplified view of an embodiment of a load lock according to the disclosure for illustration of the method according to the disclosure;

FIG. 8k shows simplified a view of an embodiment of a load lock according to the disclosure for illustration of the method according to the disclosure;

FIG. 8l shows a simplified view of an embodiment of a load lock according to the disclosure for illustration of the method according to the disclosure;

DETAILED DESCRIPTION

Figure 1:
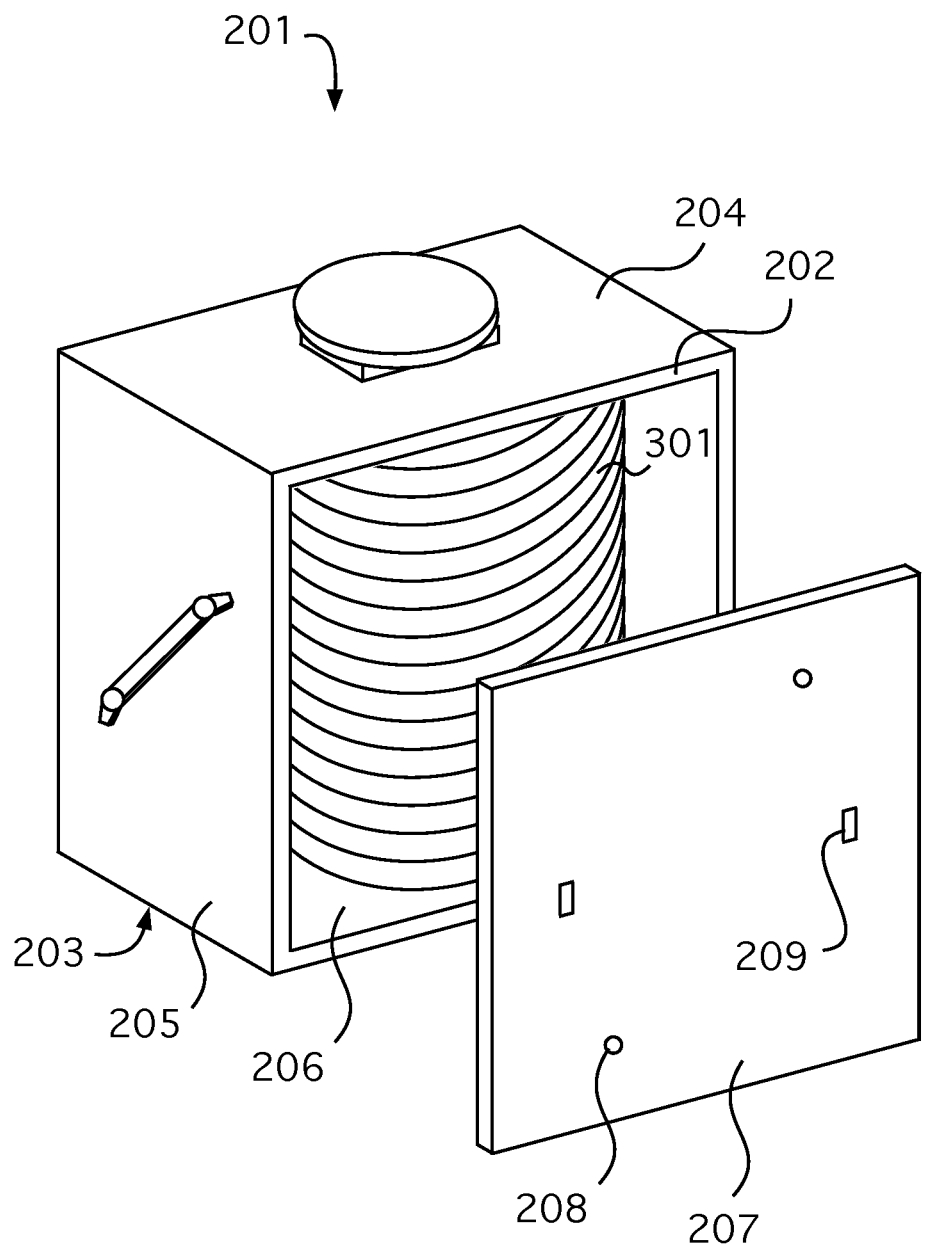
FIG. 1 shows a substrate container according to the prior art.

FIG. 1 shows a substrate container 201 with a housing 202 having a bottom 203, a ceiling 204 as well as side walls 205. The housing 202 has an access opening 206 via which substrates 301 can be inserted into the substrate container 201 and via which the substrates can be taken out of the substrate container 201. The access opening is formed on the front side of the housing 202. A lid 207 is provided for closing the access opening 206 which in FIG. 1 has already been removed from the access opening, so that FIG. 1 shows an opened substrate container. Handles are formed on two opposite side walls 205 that are to facilitate setting down and picking up of the substrate container 201. Positioning pegs 208 and recesses 209 are formed on the outside of the lid 207. The positioning pegs 208 enable the lid 207 to be positioned on the opening mechanism 31. The recess 209 enables mechanical interaction with the opening mechanism 31 to take off the lid 207 of the housing 202 to open the substrate container 201 and to attach it to the housing 202 to close the substrate container 201. The substrate container may be a standard substrate container in accordance with SEMI E47.1-0704 "Provisional Mechanical Specification for FOUPS Used to Transport and Store 300 mm Wafers".

Figure 2A:
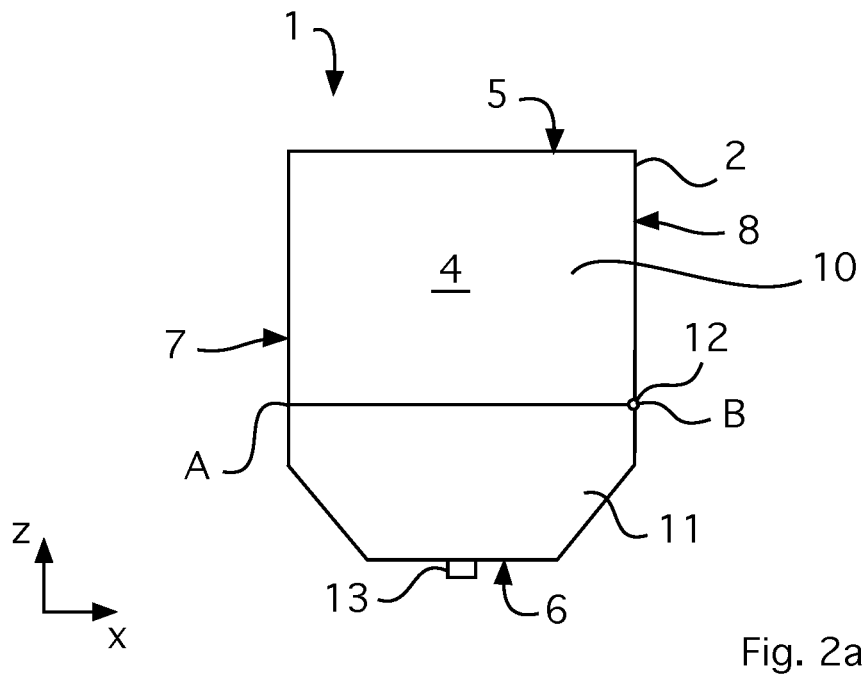
FIG. 2a shows a plan view of one embodiment of a load lock according to the disclosure in the closed state.
Figure 2B:
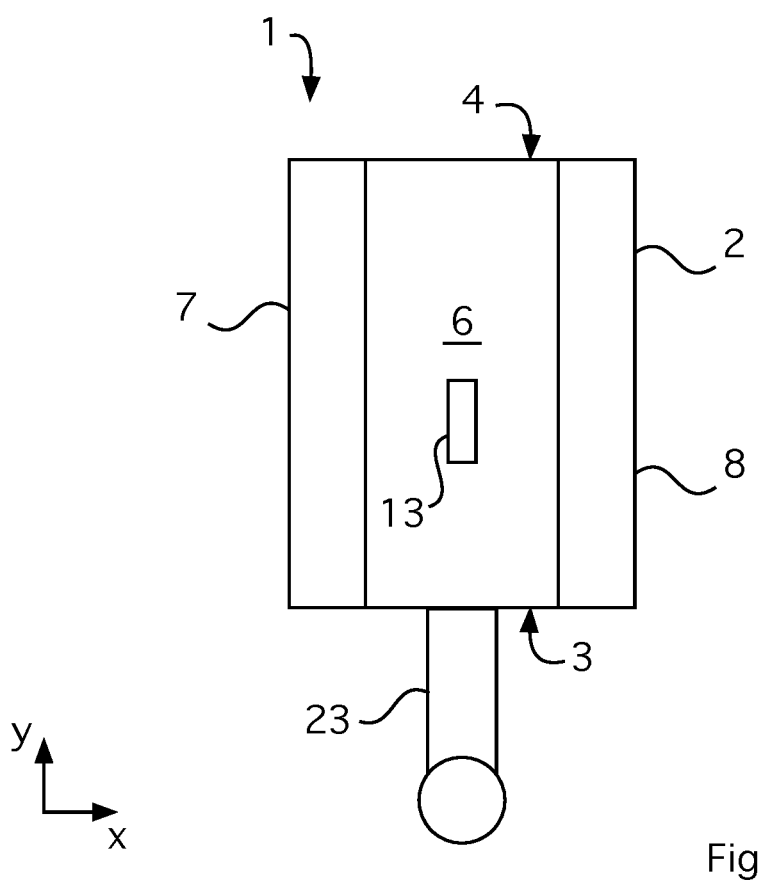
FIG. 2b shows a front view of one embodiment of a load lock according to the disclosure in the closed state.
Figure 3A:
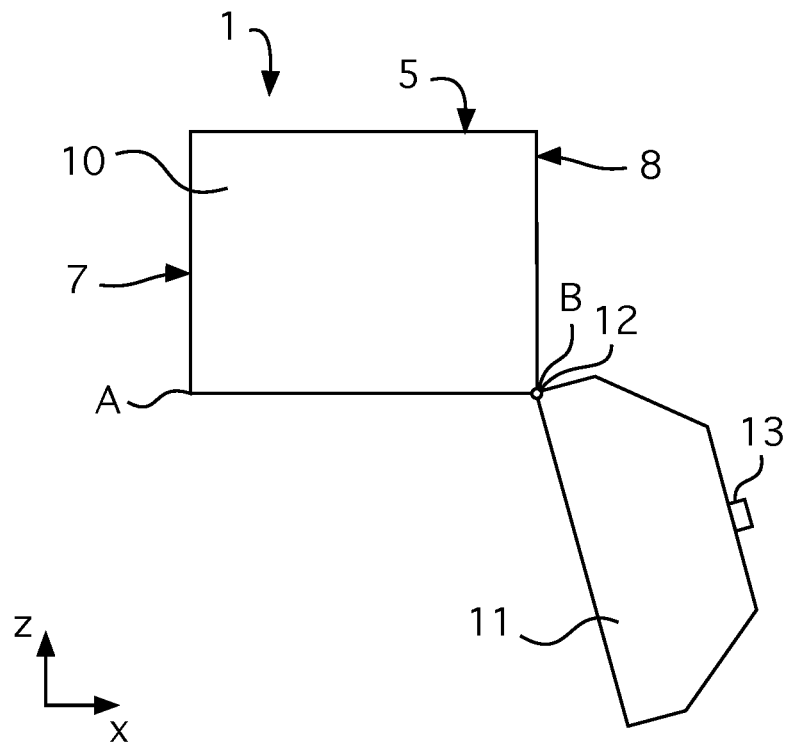
FIG. 3a shows a plan view of the embodiment of a load lock according to the disclosure in the open state shown in FIG. 2.
Figure 3B:
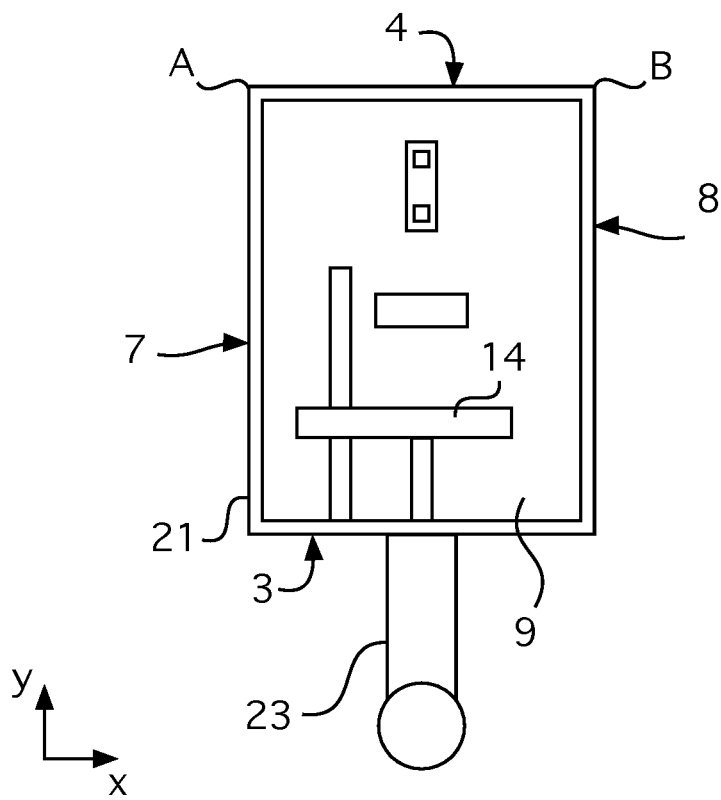
FIG. 3b shows a front view of the embodiment of a load lock according to the disclosure in the open state shown in FIG. 2.
Figure 4:
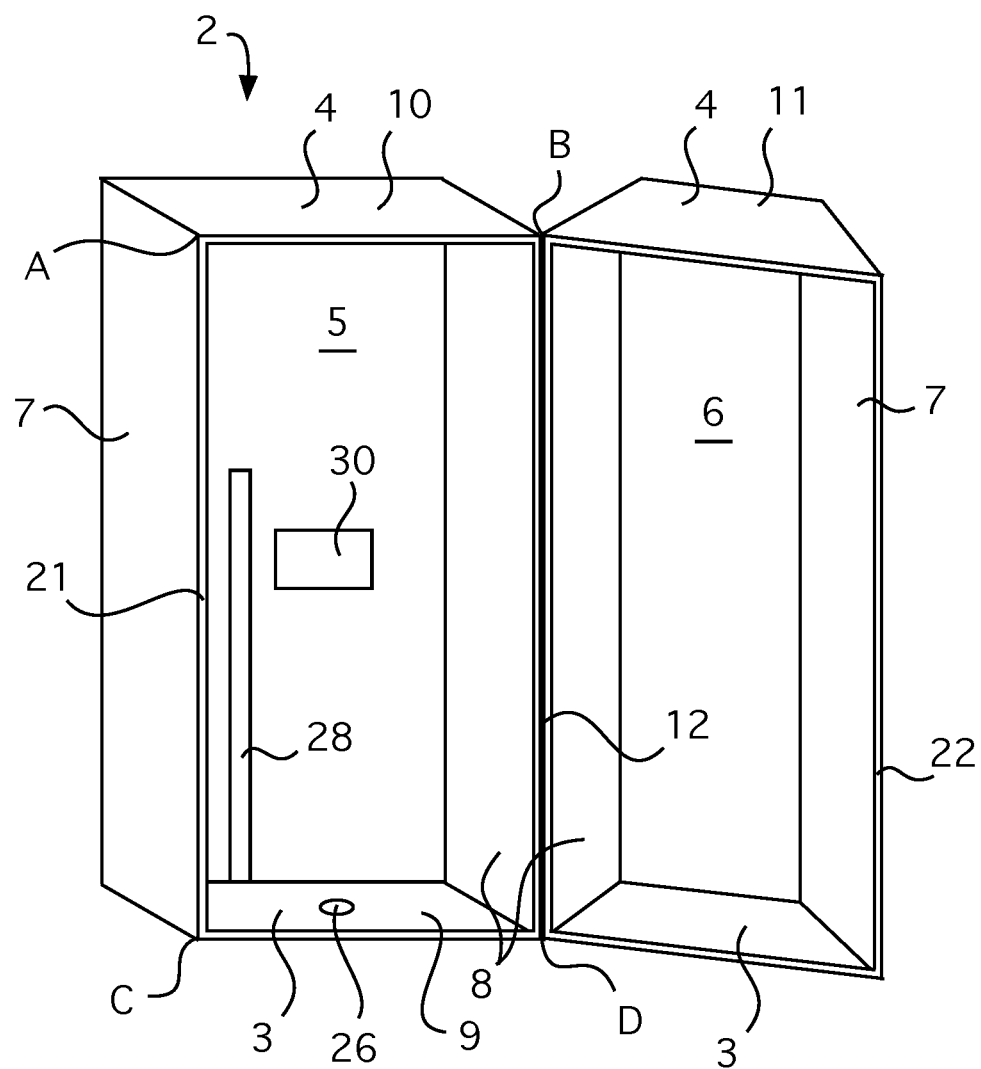
FIG. 4 shows a perspective view especially of the load chamber of the embodiment of the load lock according to the disclosure shown in FIG. 2.
Figure 4:
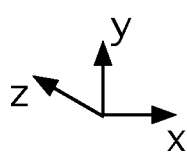

FIGS. 2 and 3 show an embodiment of the load lock 1 according to the invention. Load lock 1 has a load chamber 2 that has a bottom 3, a ceiling 4, a rear wall 5, a front wall 6, a first side wall 7, and a second side wall 8 that define an interior 9. Here, the rear wall 5 and the front wall 6 are located opposite to each other. The rear wall 5 and the front wall 6 are connected to each other via the first and second side walls 7, 8. The load chamber 2 can be divided into a first part 10 and a second part 11. The dividing plane extends in a vertical plane at points A, B, C, and D in FIG. 2 bis 4 (x,y plane of Cartesian coordinate system). Here, the dividing plane extends toward the rear wall offset to the front wall through the first side wall 7, the second side wall 8, the bottom 3, and the ceiling 4 of the load chamber 2. The first part 10 of the load chamber 2 has a circumferential edge 21 that fits to a circumferential edge 22 of the second part 11 in a pressure-tight manner in the closed state of the load chamber 2. For that, sealing means 20 are provided on the whole edge 21 of the first part 10 and/or on the whole edge 22 of the second part 11 (see also FIG. 6). The first part 10 and the second part 11 are connected to each other via a hinge 12 on a vertical axis that extends through points B and D of the dividing plane and lies on the y coordinate. To open the load chamber 2 the second part 11 is pivoted by means of the hinge 12 about the vertical axis B-D. Thereby, the first part 10 is separated from the second part 11, so that the first part 10 on its edge 21 and the second part 11 on its edge 22 are exposed. To facilitate opening and closing of the load chamber 2 a handle 13 may be attached to the outside of the front wall 6.

In the interior 9 of the load chamber 2 there is a carrier unit 14. The carrier unit 14 has a base element 15 (see FIG. 6) with an upper surface 16 and a lower surface 17. Here, the upper surface 16 is in a horizontal plane. A tie plate 18 is arranged on the upper surface 16 of the base element 15. The substrate container 201 can be put down to the tie plate 18 with its lower surface, bottom 203. To position the substrate container 201 on the tie plate 18, positioning pins 19 are provided on its upper surface that facilitate the positioning of the substrate container 201 on the carrier unit 14 in a given position. The interior 9 of the load chamber 2 is dimensioned such that the bottom 3, the ceiling 4, the rear wall 5, the front wall 6, the first side wall 7, and the second side wall 8 are spaced apart from the substrate container 201 that is put down to the carrier unit 14 in the given position.

For lifting and lowering the carrier unit 14 a lifting unit 23 is provided. The lifting unit 23 has a guide 24 for vertically guiding a lifting rod 25. The guide 24 is arranged outside of the load chamber 2. The lifting rod 25 extends in the vertical direction (y coordinate) over a sealed bushing 26 in the bottom 3 of the load chamber 2 into the interior 9 of the load chamber 2. Thereon the carrier unit 14 rests with its lower surface 17. The carrier unit 14 has a slide 27 that holds the base element 15. The slide 27 runs in a vertical guide rail 28 that is arranged on the rear wall of the load chamber 2. By means of the lifting unit 23 the carrier unit 14 guided in the guide rail 28 can be lifted and lowered in the vertical direction (double arrow A). For that, the lifting unit 23 has a drive 38 that is arranged outside the load chamber 2.

Figure 5:
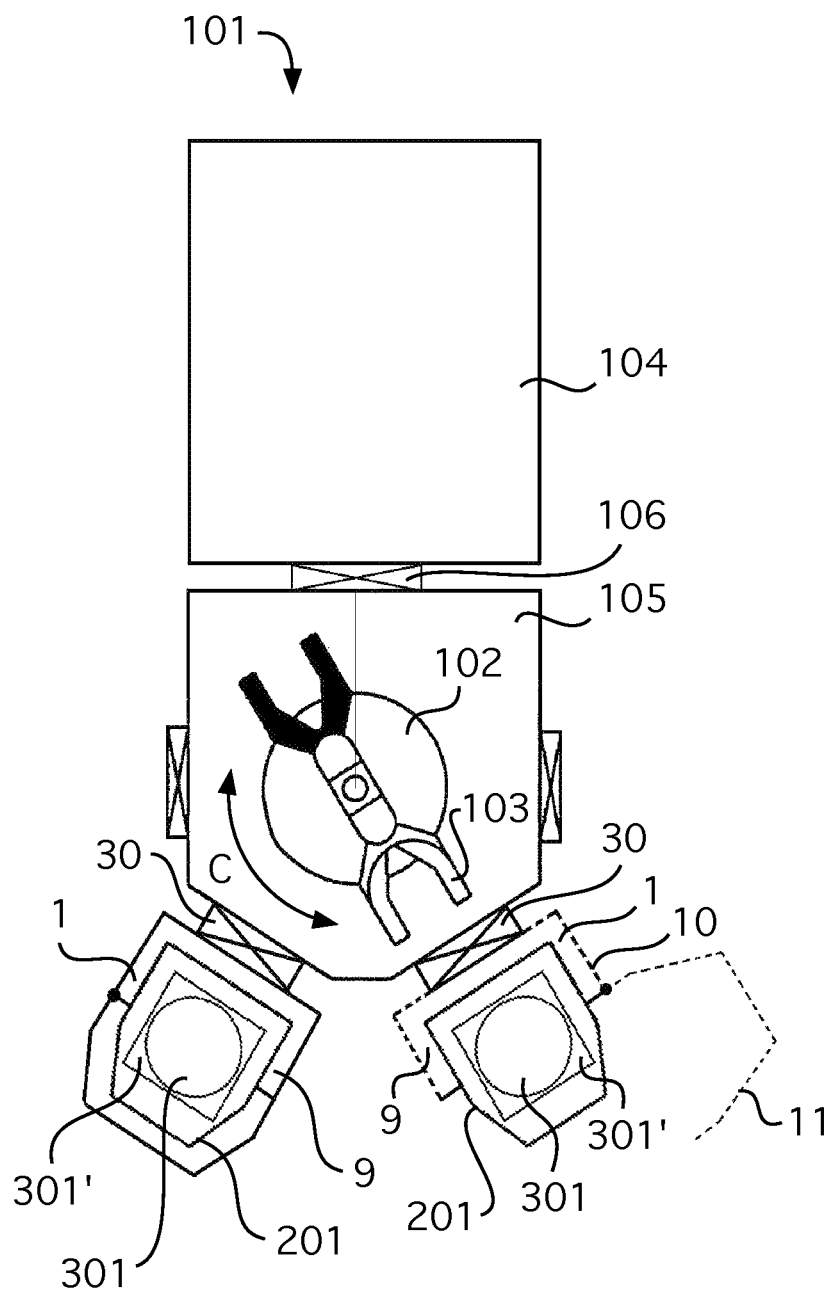
FIG. 5 shows a schematic view of a device for processing flat substrates according to the disclosure.

In the rear wall 5 of the load chamber 2 a lock opening 29 is formed that enables transfer of a substrate 301 out of an opened substrate container 201 that is present in the load chamber 2 to a device 101 for processing flat substrates or vice versa. Device 101 has a handling system 102 which may be a robot with a gripping arm 103 (see FIG. 5). Gripping arm 103 may be passed through the lock opening 29 in the opened substrate container 201 to transfer a substrate 301 to there put down or take up a substrate 301. The lock opening 29 is arranged in the geometric center of the rear wall 5. Lock opening 29 is closed by means of a lock valve 30. To transfer a substrate 301 from the load chamber 2 to the device 101 and out of the device 101 into the load chamber 2 the lock valve 30 is opened.

The load lock 1 further has an opening mechanism 31 with which the substrate container lid 207 may be taken off from the access opening 206 and put onto to the access opening 206. The opening mechanism 31 is arranged within the load chamber above the lock opening 29. The opening mechanism 31 has engagement means 32 that can be engaged with the recesses 209 formed in the lid 207. Here, the engagement means 32 can interact with an interlocking mechanism that blocks the engagement means 32 in the recesses 209 or unlocks the engagement means 32 blocked there. The opening mechanism 31 has guide means 33 for the engagement means 32. By means of the guide means the engagement means—and with them the lid 207 if the engagement means 32 are blocked in the recesses 209 of the lid 207—in horizontal direction (double arrow B) can be moved. The guide means 33 are guided through bushings 34 that are formed in the rear wall 5 of the load chamber 2. The opening mechanism 31 has drives 36 that are arranged outside the load chamber 2.

The load chamber 2 has one or more terminals 37 via which by means of a pressure adjusting means (not shown) a pressure $p_2$ can be adjusted in the load chamber 2 that differs from the environmental pressure $p_1$, generally atmospheric pressure.

On the rear wall 5 of the load chamber 2 an identification system 39 in the form of a sensor is arranged, namely above the lock opening 29 and below the opening mechanism 31. By means of the identification system 39 the substrate container 201 that is present in the load chamber 2 and/or the substrates 301 that are present in the substrate container can be identified.

The load lock 2 is attached to a device 101 for processing flat substrates. The device 101 is a pressure process plant. It has a process chamber 104 in which flat substrates can be processed. The process chamber 104 is connected to a handling chamber 105 via a lock 106. On the handling chamber 105 two load locks 1 according to the invention are arranged. Here, the lock openings 29 are arranged in alignment with the openings of the handling chamber 105. In the handling chamber 105 there is the handling system 102 with its gripping arm 103. By means of the handling system 102 a substrate 301 can be taken out of one of the load locks 1 and transferred to the process chamber 104 and vice versa. For that, the handling system 102 with the substrate 301 held by the gripping arm 103 is able to rotate about a vertical axis within the handling chamber 105 (double arrow C). In FIG.

5 in both load locks 1 a flat substrate 301' with a square cross section is shown in addition to a flat substrate 301 that has a circular cross section.

Figure 8M:
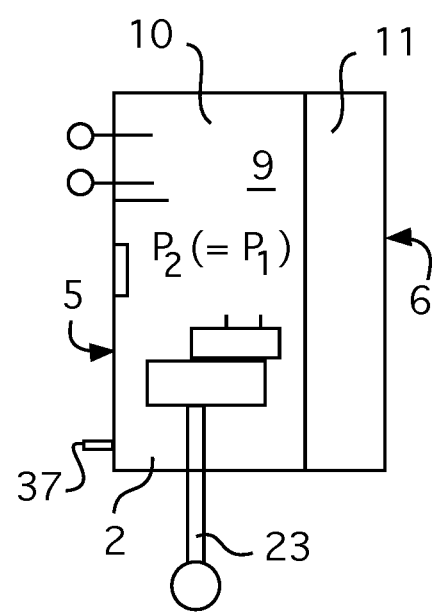
FIG. 8m shows a simplified view of an embodiment of a load lock according to the disclosure for illustration of the method according to the disclosure.

FIGS. 8a to 8m illustrate one embodiment of the method according to the invention. Here, the load lock 2 is depicted very simplified, each. In the example shown, it is started with an empty load chamber 2 into which a substrate container 201 is to be introduced that contains substrates 301. That is, first, the load chamber 2 is empty and closed (FIG. 8a). The upper surface of the carrier unit 14 is in a starting position, i.e. at a height relative to the vertical coordinate y that approximately corresponds to half the height of the interior 9 of the load chamber 2. In this example, the starting position corresponds to a transfer position, i.e. a position that enables transfer of a substrate 301 out of a substrate container 201 if an opened substrate container 201 would be present on the upper surface of the carrier unit 14. The pressure $p_2$ in the load chamber corresponds to the environmental pressure $p_1$.

Figure 6:
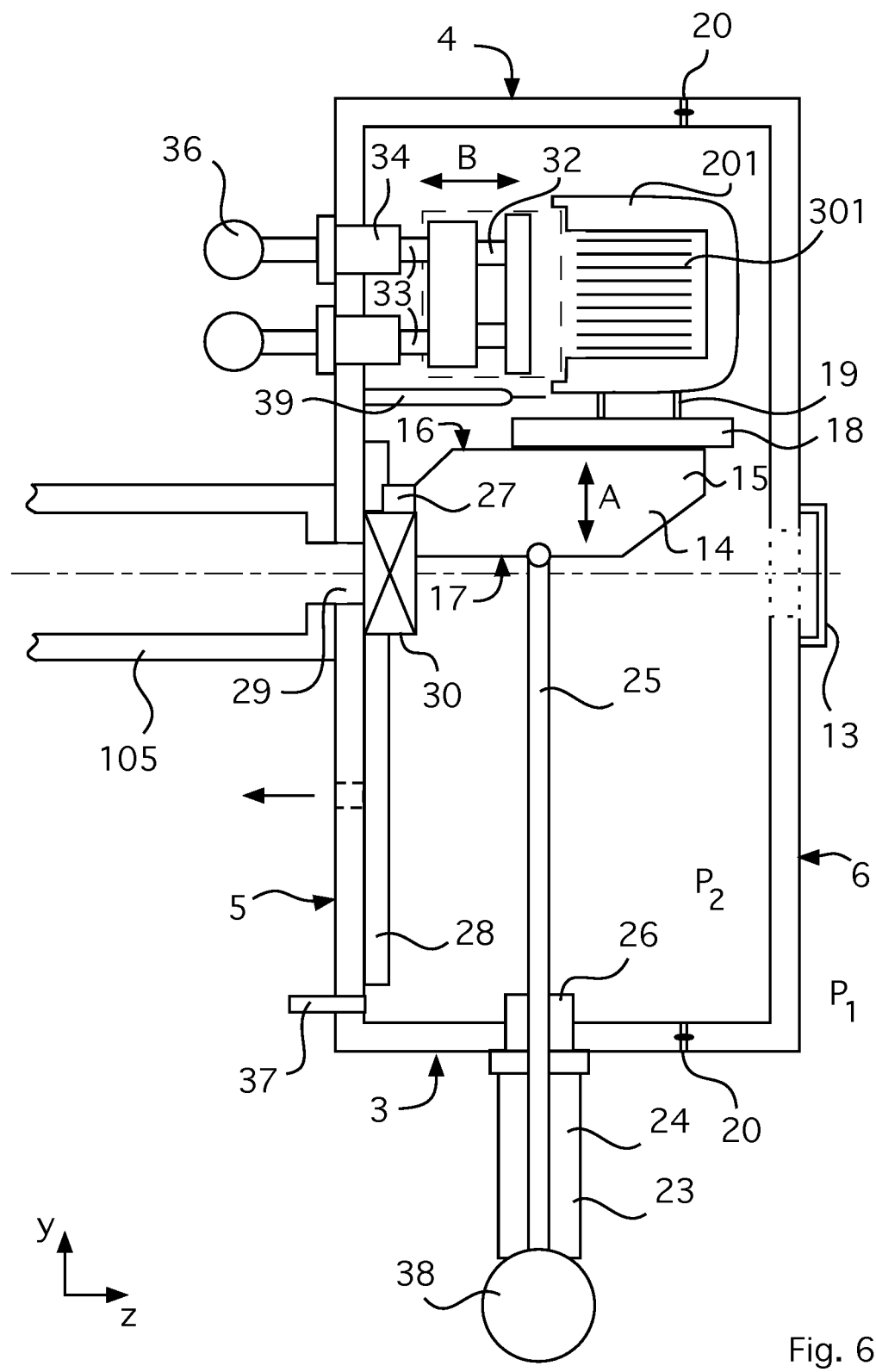
FIG. 6 shows a schematic view of an embodiment of a load lock according to the disclosure for illustration of the method according to the disclosure, wherein a substrate container is in the opening and closing position.

Now, the load chamber 2 is opened (FIG. 8b). For that, the load chamber 2 is separated along the dividing plane into a first part 10 and a second part 11. Subsequently, a substrate container 201 containing substrates 301 is put down to the carrier unit 14 (FIG. 8c), so that it is in a given position on the carrier unit 14. Now, the load chamber 2 is transferred to its closed state (FIG. 8d) by re-combining the second part 11 with the first part 10. Subsequently, the substrate container 201 can be lifted from the starting position along a vertical axis to the opening and closing position (FIG. 8e, see also arrow A in FIG. 6). In the opening and closing position the lid 207 is taken off of the substrate container 201 by means of the opening mechanism 31 (FIG. 8f) and held by the opening mechanism 31 until it is put down again (see arrow B in FIG. 6). After having taken off the lid 207 the interior of the substrate container now is accessible and is ready to at least approximately adapt the pressure to the pressure in the process chamber of the pressure process plant 101. The opened substrate container 201 is lowered from the opening and closing position to the identification position (FIG. 8g). There, the substrate container 201 and/or the substrates 301 contained therein can be identified by means of the identification system 39. Subsequently, pressure compensation is carried out. Here, it is adjusted a pressure $p_2$ in the load chamber 2 via the terminal 37 that differs from the environmental pressure $p_1$. Pressure $p_2$ is at least approximately in the same order as the pressure at which processing of the substrate 301 is to be performed in the pressure process plant 101. An exact pressure control can separately take place in the sealable process chamber 104.

Figure 7:
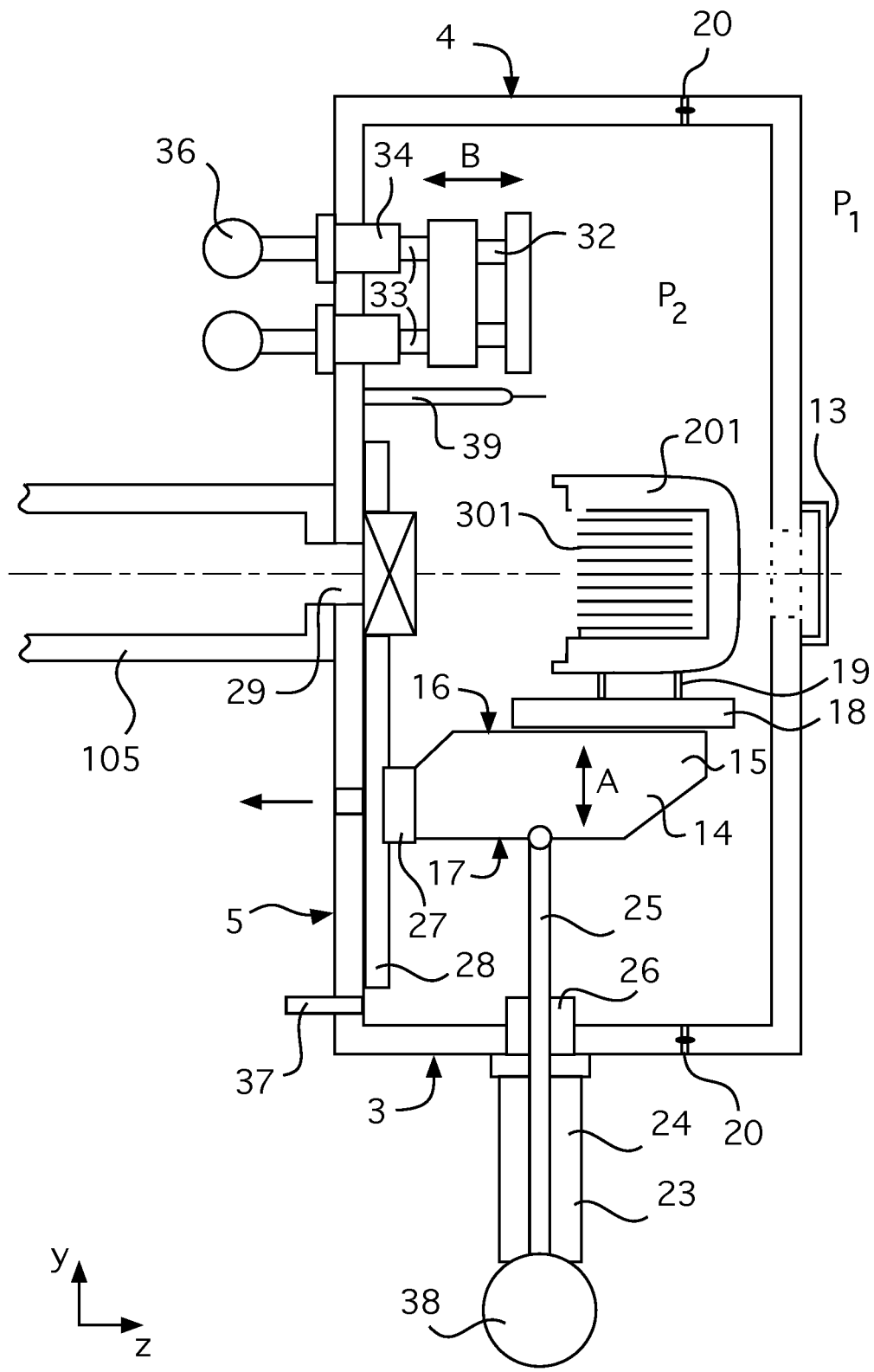
FIG. 7 shows a further schematic view of an embodiment of a load lock according to the disclosure for illustration of the method according to the disclosure, wherein a substrate container is in the transfer position.

After pressure compensation the open substrate container 201 is lowered from the identification position to a transfer position (FIG. 8h, see also FIG. 7). In the transfer position a substrate 301' that is to be taken out of the substrate container 201 is at the height of the lock opening 29. The lock valve is opened whereby the lock opening 29 is open. Now, substrate 301' is moved into the handling chamber 105 (not shown) through the opened lock valve 30 and thus, through the lock opening 29.

If further substrates 301 are to be taken out of the substrate container 201, the substrate container 201 has to be transferred to the transfer positions where the respective substrate is at the height of the lock opening 29. However, this is not shown in FIG. 8. The figures following FIG. 8h show the further procedure when the substrate container 201, from which the substrate 301' just has been taken out, is to be taken out of the load lock 2. For that the lock valve 30 is closed, so that pressure compensation is enabled again.

Here, pressure $p_2$ is brought to the environmental pressure $p_1$ again. Subsequently, the substrate container 201 is lifted from the transfer position to the opening and closing position and the lid 207 is put down to the substrate container 201 again by means of the opening mechanism 31 (FIG. 8i). Then, the closed substrate container 201 is lowered to the starting position (FIG. 8j). Then, the load chamber 2 is opened by dividing it along the dividing plane into a first part 10 and a second part 11 (FIG. 8k). Then, the substrate container 201 is taken out of the load chamber 2 (FIG. 8l). After having closed the load chamber, the state shown in FIG. 8a is obtained (FIG. 8m).

FIGS. 6 and 7 show the load lock according to the invention together with a part of the handling chamber 105. However, this is not part of the load lock 2. Rather, there is shown a part of the handling chamber 105 to illustrate that the lock opening of the load chamber 2 abuts on an opening in the handling chamber 105.

The invention claimed is:

1. A load lock for a substrate container, the substrate container comprising:
   a housing for receiving flat substrates which has a bottom, a ceiling, and side walls,
   wherein the load lock has a load chamber for receiving the substrate container, the load chamber having a bottom, a ceiling, a rear wall, a front wall, and a first side wall and a second side wall which connect the rear wall to the front wall,
   wherein a carrier unit for receiving the substrate container is arranged in the load chamber,
   wherein the load chamber is divided into a first part and a second part along a dividing plane to open the load chamber, the dividing plane extending between the rear wall and the front wall and through the first side wall, the second side wall, the bottom and the ceiling of the load chamber,
   wherein the load chamber is provided with a lifting unit for lifting and lowering the carrier unit into an opening and closing position, a transfer position, and an identification position,
   wherein, in the opening and closing position, an upper surface of the carrier unit is positioned such that an opening mechanism may remove or replace a lid of the substrate container,
   wherein, in the transfer position, the upper surface of the carrier unit is positioned such that substrates contained within the substrate container may be transferred into or out of the substrate container, and
   wherein, in the identification position, the upper surface of the carrier unit is positioned such that an identification system may identify substrates in the substrate container.

2. The load lock according to claim 1, wherein, in a closed state, the load chamber is sealed against the environment, and
   wherein the load lock has pressure adjusting means for adjusting a pressure in the load chamber.

3. The load lock according to claim 1, wherein the carrier unit has a slide guided by a guide means.

4. The load lock according to claim 3, wherein the guide means is arranged on the rear wall of the load chamber.

5. The load lock according to claim 4, wherein a bushing for the lifting unit is arranged in the bottom of the load chamber.

6. The load lock according to claim 1, wherein a lock opening for transferring a substrate out of or into the load chamber is formed in the rear wall of the load chamber, wherein the lock opening can be closed by means of a lock valve.

7. The load lock according to claim 6, wherein the opening mechanism is arranged above or below the lock opening.

8. The load lock according to claim 1, wherein the identification system is arranged on the rear wall of the load chamber.

9. A device for processing flat substrates comprising:
   a process chamber for processing one or more flat substrates;
   a load lock: and
   a handling system,
   wherein the load lock receives a substrate container, the substrate container comprising a housing for receiving flat substrates which has a bottom, a ceiling, and side walls,
   wherein the load lock has a load chamber for receiving the substrate container, the load chamber comprising a bottom, a ceiling, a rear wall, a front wall, and a first side wall and a second side wall which connect the rear wall to the front wall,
   wherein a carrier unit for receiving the substrate container is arranged in the load chamber,
   wherein the load chamber is divided into a first part and a second part along a dividing plane to open the load chamber, the dividing plane extending between the rear wall and the front wall and through the first side wall, the second side wall, the bottom and the ceiling of the load chamber,
   wherein the load chamber is provided with a lifting unit for lifting and lowering the carrier unit into an opening and closing position, a transfer position, and an identification position,
   wherein, in the opening and closing position, an upper surface of the carrier unit is positioned such that an opening mechanism may remove or replace a lid of the substrate container,
   wherein, in the transfer position, the upper surface of the carrier unit is positioned such that substrates contained within the substrate container may be transferred into or out of the substrate container, and
   wherein, in the identification position, the upper surface of the carrier unit is positioned such that an identification system may identify substrates in the substrate container, and
   wherein the handling system is configured to transfer one or more substrates between the substrate container received by the carrier unit and the process chamber through a lock opening of the load chamber.

10. A method for operating a load lock comprising the steps of:
    (a) opening a load chamber about a dividing plane which splits the load chamber into a first and a second part;
    (b) putting a substrate container onto a carrier unit;
    (c) closing the load chamber by joining the first and the second part;
    (d) removing a lid from the substrate container by means of an opening mechanism; and
    (e) removing at least one substrate from the substrate container,
    wherein the load chamber is provided with a lifting unit for lifting and lowering the carrier unit into an opening and closing position, a transfer position, and an identification position,
    wherein, in the opening and closing position, an upper surface of the carrier unit is positioned such that the opening mechanism may remove or replace a lid of the substrate container,
    wherein, in the transfer position, the upper surface of the carrier unit is positioned such that substrates contained within the substrate container may be transferred into or out of the substrate container, and
    wherein, in the identification position, the upper surface of the carrier unit is positioned such that an identification system may identify substrates in the substrate container.

11. The method according to claim 10, wherein upon removal of the lid in step (d), a pressure is set in the load chamber that differs from the environmental pressure.

* * * * *